(12) United States Patent
Miyano

(10) Patent No.: US 9,531,363 B2
(45) Date of Patent: Dec. 27, 2016

(54) METHODS AND APPARATUSES INCLUDING COMMAND LATENCY CONTROL CIRCUIT

(71) Applicant: Micron Technology, Inc., Boise, ID (US)

(72) Inventor: Kazutaka Miyano, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/698,550

(22) Filed: Apr. 28, 2015

(65) Prior Publication Data
US 2016/0322964 A1  Nov. 3, 2016

(51) Int. Cl.
| | | |
|---|---|---|
| H03L 7/06 | (2006.01) |
| H03K 5/135 | (2006.01) |
| H03K 5/14 | (2014.01) |
| H03K 3/037 | (2006.01) |
| H03L 7/081 | (2006.01) |

(52) U.S. Cl.
CPC ............. *H03K 5/135* (2013.01); *H03K 3/037* (2013.01); *H03K 5/14* (2013.01); *H03L 7/0812* (2013.01)

(58) Field of Classification Search
USPC ................................. 327/147–149, 156–158
See application file for complete search history.

(56) References Cited

U.S. PATENT DOCUMENTS

| | | |
|---|---|---|
| 5,004,933 A | 4/1991 | Widener |
| 6,111,810 A | 8/2000 | Fujita |
| 6,219,384 B1 | 4/2001 | Kliza et al. |
| 6,260,128 B1 | 7/2001 | Ohshima et al. |
| 6,275,077 B1 | 8/2001 | Tobin et al. |
| 6,327,318 B1* | 12/2001 | Bhullar ................. H03L 7/0814 375/374 |
| 6,424,592 B1 | 7/2002 | Maruyama |

(Continued)

FOREIGN PATENT DOCUMENTS

| | | |
|---|---|---|
| CN | 101752009 A | 6/2010 |
| JP | 2013-222997 | 10/2013 |
| TW | 201303735 | 1/2013 |

OTHER PUBLICATIONS

"Interfacing DDR SDRAM with Stratix II Devices", Version 3.2, Altera Corp, Sep. 2008.

(Continued)

*Primary Examiner* — Adam Houston
(74) *Attorney, Agent, or Firm* — Dorsey & Whitney LLP

(57) ABSTRACT

Methods and apparatus including a latency control circuit are described. An example apparatus includes a delay line circuit configured to delay a clock signal, and a latch control circuit configured to receive the clock signal and the delayed clock signal. The latch control circuit is configured to provide first control signals based on a count associated with the first clock signal. The latch control circuit is further configured to provide second control signals based on the count associated with the first clock signal. The second clock signals are delayed relative to the first clock signals by an amount substantially equal to a delay between the clock signal and the delayed clock signal. The example apparatus further includes a latch circuit configured to latch an input signal responsive to the first control signals. The latch circuit is further configured to provide the latched signal to an output responsive to the second control signals.

25 Claims, 7 Drawing Sheets

(56) References Cited

U.S. PATENT DOCUMENTS

| | | | |
|---|---|---|---|
| 6,438,055 | B1 | 8/2002 | Taguchi et al. |
| 6,459,313 | B1 | 10/2002 | Godbee et al. |
| 6,489,823 | B2 * | 12/2002 | Iwamoto .............. G11C 7/1072 327/158 |
| 6,510,095 | B1 | 1/2003 | Matsuzaki et al. |
| 6,636,110 | B1 | 10/2003 | Ooishi et al. |
| 6,687,185 | B1 | 2/2004 | Keeth et al. |
| 6,710,726 | B2 | 3/2004 | Kim et al. |
| 6,744,285 | B2 * | 6/2004 | Mangum ................ G06F 1/12 326/96 |
| 6,781,861 | B2 | 8/2004 | Gomm et al. |
| 6,839,288 | B1 | 1/2005 | Kim et al. |
| 6,861,901 | B2 | 3/2005 | Prexl et al. |
| 6,914,798 | B2 | 7/2005 | Kwon et al. |
| 6,930,955 | B2 | 8/2005 | Johnson et al. |
| 6,973,008 | B2 | 12/2005 | Krause |
| 6,980,479 | B2 | 12/2005 | Park |
| 6,988,218 | B2 | 1/2006 | Drexler |
| 7,042,799 | B2 | 5/2006 | Cho |
| 7,046,060 | B1 | 5/2006 | Minzoni et al. |
| 7,058,799 | B2 | 6/2006 | Johnson |
| 7,061,941 | B1 | 6/2006 | Zheng |
| 7,065,001 | B2 | 6/2006 | Johnson et al. |
| 7,111,185 | B2 | 9/2006 | Gomm et al. |
| 7,119,591 | B1 | 10/2006 | Lin |
| 7,170,819 | B2 | 1/2007 | Szczypinski |
| 7,187,599 | B2 | 3/2007 | Schnell et al. |
| 7,209,396 | B2 | 4/2007 | Schnell |
| 7,248,512 | B2 | 7/2007 | Shin |
| 7,268,605 | B2 | 9/2007 | Fang et al. |
| 7,269,754 | B2 | 9/2007 | Ramaswamy et al. |
| 7,280,430 | B2 | 10/2007 | Lee |
| 7,336,752 | B2 | 2/2008 | Vlasenko et al. |
| 7,340,632 | B2 | 3/2008 | Park |
| 7,375,560 | B2 | 5/2008 | Lee et al. |
| 7,411,852 | B2 | 8/2008 | Nishioka et al. |
| 7,443,216 | B2 | 10/2008 | Gomm et al. |
| 7,451,338 | B2 | 11/2008 | Lemos |
| 7,463,534 | B2 | 12/2008 | Ku et al. |
| 7,489,172 | B2 | 2/2009 | Kim |
| 7,509,517 | B2 | 3/2009 | Matsumoto et al. |
| 7,580,321 | B2 | 8/2009 | Fujisawa et al. |
| 7,590,013 | B2 | 9/2009 | Yu et al. |
| 7,593,273 | B2 | 9/2009 | Chu et al. |
| 7,609,584 | B2 | 10/2009 | Kim et al. |
| 7,616,040 | B2 | 11/2009 | Motomura |
| 7,631,248 | B2 | 12/2009 | Zakharchenko et al. |
| 7,643,334 | B1 | 1/2010 | Lee et al. |
| 7,656,745 | B2 | 2/2010 | Kwak |
| 7,660,187 | B2 | 2/2010 | Johnson et al. |
| 7,663,946 | B2 | 2/2010 | Kim |
| 7,671,648 | B2 | 3/2010 | Kwak |
| 7,675,439 | B2 | 3/2010 | Chang et al. |
| 7,698,589 | B2 | 4/2010 | Huang |
| 7,715,260 | B1 | 5/2010 | Kuo et al. |
| 7,716,510 | B2 | 5/2010 | Kwak |
| 7,751,261 | B2 | 7/2010 | Cho |
| 7,773,435 | B2 | 8/2010 | Cho |
| 7,822,904 | B2 | 10/2010 | LaBerge |
| 7,826,305 | B2 | 11/2010 | Fujisawa |
| 7,826,583 | B2 | 11/2010 | Jeong et al. |
| 7,872,924 | B2 | 1/2011 | Ma |
| 7,885,365 | B2 | 2/2011 | Hagleitner et al. |
| 7,913,103 | B2 | 3/2011 | Gold et al. |
| 7,945,800 | B2 | 5/2011 | Gomm et al. |
| 7,948,817 | B2 | 5/2011 | Coteus et al. |
| 7,969,813 | B2 | 6/2011 | Bringivijayaraghavan et al. |
| 7,983,094 | B1 | 7/2011 | Roge et al. |
| 8,004,884 | B2 | 8/2011 | Franceschini et al. |
| 8,018,791 | B2 | 9/2011 | Kwak |
| 8,030,981 | B2 | 10/2011 | Kim |
| 8,115,529 | B2 | 2/2012 | Shibata |
| 8,116,415 | B2 | 2/2012 | Wada et al. |
| 8,144,529 | B2 | 3/2012 | Chuang et al. |
| 8,321,714 | B2 | 11/2012 | Wu et al. |
| 8,358,546 | B2 | 1/2013 | Kim et al. |
| 8,392,741 | B2 | 3/2013 | Kim et al. |
| 8,441,888 | B2 | 5/2013 | Bringivijayaraghavan et al. |
| 8,509,011 | B2 | 8/2013 | Bringivijayaraghavan |
| 8,644,096 | B2 | 2/2014 | Bringivijayaraghavan |
| 8,717,078 | B2 | 5/2014 | Idgunji et al. |
| 8,732,509 | B2 | 5/2014 | Kwak |
| 8,788,896 | B2 | 7/2014 | Tekumalla |
| 9,001,955 | B2 | 4/2015 | Lamanna et al. |
| 9,053,815 | B2 | 6/2015 | Bell |
| 9,054,675 | B2 | 6/2015 | Mazumder et al. |
| 9,166,579 | B2 | 10/2015 | Huber et al. |
| 9,329,623 | B2 | 5/2016 | Vankayala |
| 2001/0015924 | A1 | 8/2001 | Arimoto et al. |
| 2002/0057624 | A1 | 5/2002 | Manning |
| 2003/0117864 | A1 | 6/2003 | Hampel et al. |
| 2003/0147299 | A1 | 8/2003 | Setogawa |
| 2003/0161210 | A1 | 8/2003 | Acharya et al. |
| 2005/0024107 | A1 | 2/2005 | Takai et al. |
| 2005/0047222 | A1 | 3/2005 | Rentschler |
| 2005/0132043 | A1 | 6/2005 | Wang et al. |
| 2005/0270852 | A1 | 12/2005 | Dietrich et al. |
| 2006/0062341 | A1 | 3/2006 | Edmondson et al. |
| 2006/0064620 | A1 * | 3/2006 | Kuhn .................. G11C 29/028 714/742 |
| 2006/0155948 | A1 | 7/2006 | Ruckerbauer |
| 2006/0182212 | A1 | 8/2006 | Hwang et al. |
| 2006/0193194 | A1 | 8/2006 | Schnell |
| 2007/0033427 | A1 | 2/2007 | Correale, Jr. et al. |
| 2007/0046346 | A1 | 3/2007 | Minzoni |
| 2007/0088903 | A1 | 4/2007 | Choi |
| 2007/0192651 | A1 | 8/2007 | Schoch |
| 2007/0291558 | A1 | 12/2007 | Joo |
| 2008/0080267 | A1 | 4/2008 | Lee |
| 2008/0080271 | A1 | 4/2008 | Kim |
| 2008/0082707 | A1 | 4/2008 | Gupta et al. |
| 2008/0126822 | A1 | 5/2008 | Kim et al. |
| 2008/0137471 | A1 | 6/2008 | Schnell et al. |
| 2008/0144423 | A1 | 6/2008 | Kwak |
| 2008/0232179 | A1 * | 9/2008 | Kwak .................. G11C 7/1051 365/194 |
| 2008/0232180 | A1 | 9/2008 | Kim et al. |
| 2008/0253205 | A1 | 10/2008 | Park |
| 2009/0041104 | A1 * | 2/2009 | Bogdan ............ H03K 5/15013 375/226 |
| 2009/0232250 | A1 | 9/2009 | Yamada et al. |
| 2009/0315600 | A1 | 12/2009 | Becker et al. |
| 2010/0001762 | A1 | 1/2010 | Kim |
| 2010/0066422 | A1 | 3/2010 | Tsai |
| 2010/0124090 | A1 | 5/2010 | Arai |
| 2010/0124102 | A1 | 5/2010 | Lee et al. |
| 2010/0165769 | A1 | 7/2010 | Kuroki |
| 2010/0165780 | A1 | 7/2010 | Bains et al. |
| 2010/0195429 | A1 | 8/2010 | Sonoda |
| 2010/0199117 | A1 | 8/2010 | Kwak |
| 2010/0208534 | A1 * | 8/2010 | Fujisawa .................. G11O 5/04 365/193 |
| 2010/0208535 | A1 * | 8/2010 | Fujisawa .............. G11C 7/1066 365/193 |
| 2010/0232213 | A1 | 9/2010 | Hwang et al. |
| 2010/0254198 | A1 | 10/2010 | Bringivijayaraghavan et al. |
| 2010/0327926 | A1 | 12/2010 | Takahashi |
| 2011/0047319 | A1 | 2/2011 | Jeon et al. |
| 2011/0055671 | A1 | 3/2011 | Kim et al. |
| 2011/0057697 | A1 * | 3/2011 | Miyano ................ H03L 7/0814 327/158 |
| 2011/0102039 | A1 | 5/2011 | Shin |
| 2011/0228625 | A1 | 9/2011 | Bringivijayaraghavan |
| 2011/0238866 | A1 | 9/2011 | Zitlaw |
| 2011/0238941 | A1 | 9/2011 | Xu et al. |
| 2011/0298512 | A1 | 12/2011 | Kwak |
| 2011/0314324 | A1 | 12/2011 | Ozdemir |
| 2012/0084575 | A1 | 4/2012 | Flores et al. |
| 2012/0124317 | A1 | 5/2012 | Mirichigni et al. |
| 2012/0147692 | A1 * | 6/2012 | Nakamura ........... G11C 7/1066 365/233.1 |
| 2012/0212268 | A1 * | 8/2012 | Kim ........................ H03L 7/07 327/158 |

(56) References Cited

U.S. PATENT DOCUMENTS

| | | |
|---|---|---|
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002320 A1* | 1/2013 | Lin .................. H03L 7/095 327/158 |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0329503 A1 | 12/2013 | Bringivijayaraghavan |
| 2014/0010025 A1 | 1/2014 | Bringivijayaraghavan |
| 2014/0035640 A1 | 2/2014 | Kwak et al. |
| 2014/0055184 A1* | 2/2014 | Vankayala ............. G06F 1/12 327/161 |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0258764 A1 | 9/2014 | Kwak |
| 2014/0293719 A1* | 10/2014 | Jung .................. G11C 7/02 365/194 |
| 2015/0156009 A1* | 6/2015 | Bogdan ............. H04L 27/2601 375/376 |
| 2015/0170725 A1 | 6/2015 | Kwak |
| 2015/0235691 A1 | 8/2015 | Kwak |
| 2015/0340072 A1 | 11/2015 | Mazumder |
| 2016/0056807 A1* | 2/2016 | Neidengard ......... H03K 5/1565 327/175 |

OTHER PUBLICATIONS

Lee, "How to Implement DDR SGRAM in Graphic System", Samsung Electric, 4Q1998.

U.S. Appl. No. 15/139,102, entitled "Methods and Apparatuses Including Command Delay Adjustment Circuit", filed Apr. 26, 2016 (no copy provided in accordance with the 1287 O.G. 163 waiver published Oct. 19, 2004).

U.S. Appl. No, 15/139,120, entitled "Apparatuses and Methods for Adjusting a Delay of a Command Signal Path", filed Apr. 26, 2016 (no copy provided in accordance with the 1287 O.G. 163 waiver published Oct. 19, 2004).

U.S. Appl. No. 15/243,651, entitled "Apparatuses and Methods for Adjusting Delay of Command Signal Path", filed. Aug. 22, 2016 (no copy provided in accordance with the 1287 O.G. 163 waiver published Oct. 19, 2004).

* cited by examiner

METHODS AND APPARATUSES INCLUDING COMMAND LATENCY CONTROL CIRCUIT

DESCRIPTION OF RELATED ART

In many devices, synchronous integrated circuits may be clocked by an external clock signal and perform operations at predetermined times relative to the rising and falling edges of the external clock signal. For example, in dynamic random access memories ("DRAMs"), the timing of external signals, such as command, address and write data signals, is determined by the external clock signal, and the memory device must latch these signals at the proper times to successfully capture the signals. To latch these applied signals, an internal clock signal may be developed based on the external clock signal, and may be conventionally applied to latches contained in the memory to clock the external signals into the latches. The internal clock signal and external clock signal must be synchronized to ensure the latches are clocked at the proper times to successfully capture the external signals.

When a read request is received at a memory, the memory must provide the associated data to a data bus at a time according to defined read latency, which is usually a predetermined number of external tCK after the read request is made by the memory controller. The memory may have its own internal clock system, which converts the external clock signal into one or more internal clock signals using internal clock generation circuits such as a clock buffer and a delay locked loop ("DLL"). Problems with maintaining read data latency arise in high speed DRAMs from the necessity to align data with the external clock using the one or more internal clock signal generated by the internal clock generation circuits.

In order to meet a specified read latency the memory device must be able to count clock signals upon receiving a read command, and activate an output latch to provide the requested data to an output bus relative to the read clock signal. The read command may be latched responsive to an internal clock signal which has a different phase relationship to the external system clock signal from the read clock. Therefore, the timing control must be required between the read clock signal and the internal clock signal when the memory device counts the latency.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
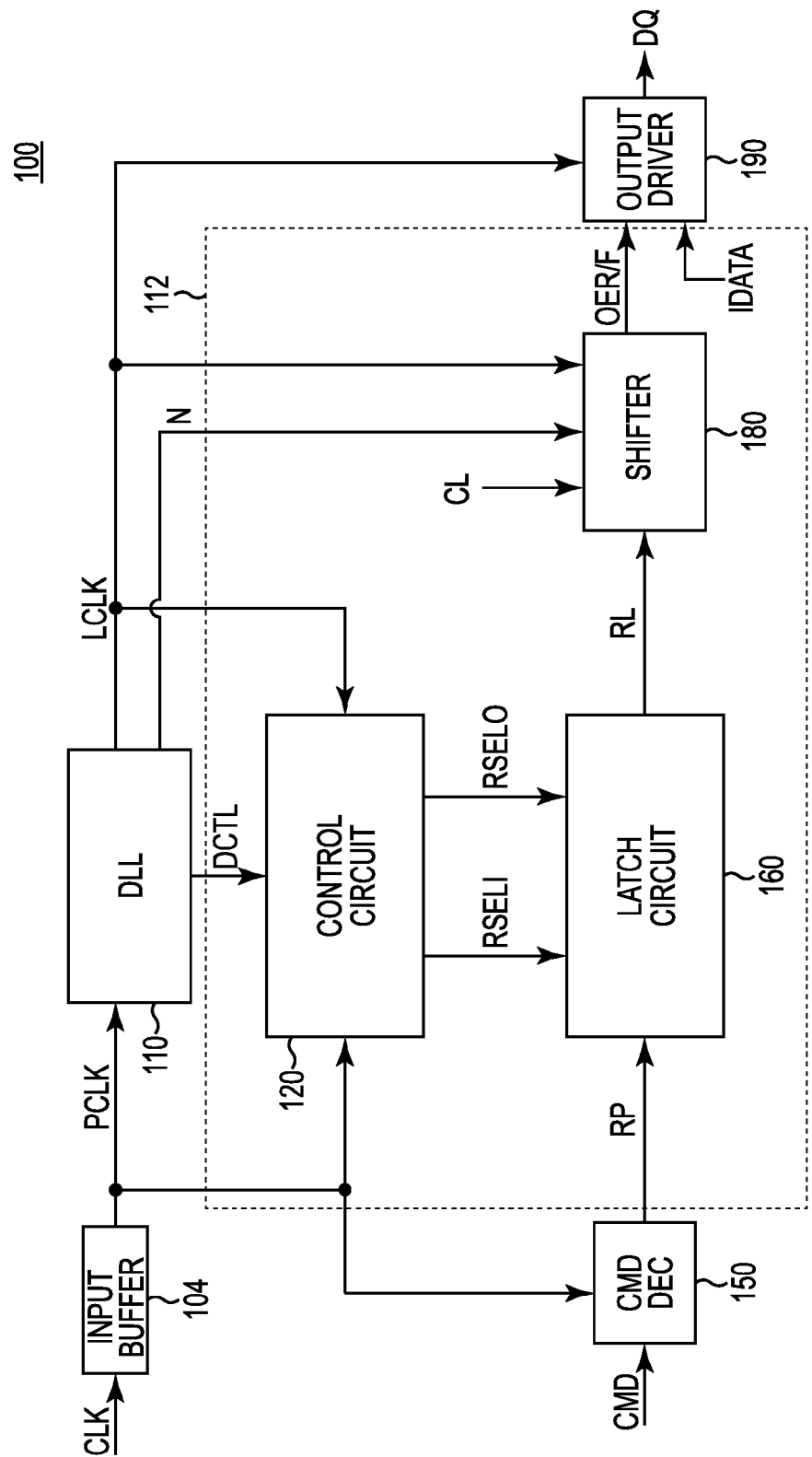
FIG. 1 is a block diagram of an apparatus that includes a latency control circuit according to an embodiment of the disclosure.

Referring to FIG. 1, a particular illustrative embodiment of an apparatus including a latency control circuit 112 is disclosed and generally designated 100. As used herein, examples of apparatuses may include an integrated circuit, a memory device, a memory system, an electronic device or system, a smart phone, a tablet, a computer, a server, etc. The apparatus 100 may include an input buffer 104 coupled to a delay-locked loop DLL 110. The input buffer 104 may be configured to receive an external clock signal CLK and to provide a buffered clock signal PCLK to the DLL 110, to the latency control circuit 112, and a command decoder 150. The DLL 110 may be configured to provide an internal clock signal LCLK, a delay control signal DCTL, and a counter signal N to the latency control circuit 112. The apparatus 100 may further include a command decoder 150 and an output driver 190. The command decoder 150 may be configured to decode a command signal CMD to provide a decoded command RP, and the output driver 190 may be configured to provide the data DQ at an output based on the internal clock signal and output enable rising/falling signals OER/F from the latency control circuit 112.

The DLL 110 may provide the LCLK signal based on the PCLK signal. The DLL 110 may adjust a delay of the PCLK signal to provide the LCLK such that timing of the DQ output from the output driver 190 matches the phase of the CLK signal. The DLL 110 may include an adjustable delay line, circuitry that models delays of circuitry of the apparatus 100, and a phase detector that detects a phase difference between the LCLK signal fed through the model delays and the PCLK signal. The DLL 110 may adjust a delay of the adjustable delay line via the DCTL signal. The DCLT signal may also be provided to the latency control circuit 112 to control propagation of the RP signal.

The command decoder 150 may be configured to decode the CMD signal respective to the PCLK signal to provide a pulse on the RP signal to the latency control circuit 112. The CMD signal may be a memory access command, such as a read, write, or on die termination (ODT) command. The latency control circuit 112 may include a latch control circuit 120 coupled to a latch circuit 160. The latch control circuit 120 may receive the PCLK signal, the DCTL signal, and the LCLK signal. The latch control circuit 120 may provide control signals RSELI and RSELO to the latch circuit 160 responsive to the PCLK, DCTL, and LCLK signals. The latch control circuit 120 may include one or more adjustable delay lines that mirror the delay line of the DLL 110, with the delay of the one or more adjustable delay lines controlled by the DCTL signals. Thus, the relative timing of the RSELI control signals to the timing of the RSELO control signals may be related to the relative timing between the PCLK and LCLK signals.

The latch circuit 160 may include latches configured to propagate the RP signal pulse to the RL signal. In some embodiments, the latch circuit 160 may include a set of input latches configured to propagate the RP signal to a set of output latches responsive to the RSELI control signals and the set of output latches may be configured to propagate the RP signal to an output as the RL signal responsive to the RSELO control signals.

The latency control circuit 112 may further include a shifter 180 configured to receive the RL signal pulse from the latch circuit 160 and a count signal N and the LCLK signal from the DLL 110. The N signal may be provided to shifter 180 after the CLK and LCLK signals are synchronized through a series of delay elements of the adjustable delay line of the DLL 110. The N signal may be a count of the number of tCK calculated by the DLL 110 to achieve the locking condition (e.g., a tCK count indicating a latency between the CLK signal and the LCLK signal). The shifter 180 is further configured to receive latency information which indicates a specified latency CL. The shifter 180 may assert the OER/F signals based on the CL, the N signal, and the LCLK signal. The output driver 190 may receive the OER/F signals, the LCLK signal, and input data IDATA, and may propagate the IDATA to data DQ responsive to the OER/F signals and the LCLK signal.

In operation, the apparatus 100 may receive a CLK signal at the input buffer 104 and the CMD signal the command decoder 150, which may be received based on timing of the PCLK signal. When the CMD signal includes a read command, the apparatus 100 may operate according to the read latency CL. The read latency CL may specify a timing of output of the IDATA to the data DQ responsive to the read command based on the CLK signal, which includes time for data to be accessed and provided on an output bus (e.g., via a DQ pad). In an example, the read latency CL may be from 6-10 tCK. The read latency CL may be fixed in the apparatus 100 at a time of manufacture or may be set by a memory controller, such as via the CMD signal. The DLL 110 and the latency control circuit 112 may apply the read latency the IDATA and synchronize the IDATA with the CLK signal.

The DLL 110 may receive the PCLK signal from the input buffer 104, and may provide the LCLK signal, which may be used by the output driver 190 to latch the IDATA data to the DQ of the apparatus 100. The LCLK may have a timing relationship relative to the PCLK signal, which may be determined by the DLL 110, and provided at an output as the N signal. The N signal may be a count of the number of tCK to achieve the locking condition (e.g., a tCK latency between receipt of the CLK signal and the LCLK signal). The locking condition may be achieved such that the LCLK signal at an output of the apparatus 100 matches a phase of the CLK signal. The N signal may be provided to the shifter 180 after the locking condition is achieved. The DLL 110 may also generate the DCTL signal, which may be used to select the delay of the adjustable delay line of the DLL 110.

The command decoder 150 may decode the CMD signal and provide the decoded CMD signal to the latency control circuit 112 as the RP signal. The latency control circuit 112 may use the PCLK and LCLK signals to change timings of internal read command pulses from being relative to the PCLK signal to being relative to the LCLK signal during a memory read operation. The latch control circuit 120 may include a counter configured to count the PCLK signals, and the RSELI control signals may be asserted based on the count of the counter. For example, the latch control circuit 120 may include a decoder that is configured to assert a single one of the RSELI control signals with every clock cycle based on the count provided by the counter. The counter value may also be used to provide the RSELO signals. In one embodiment, the latch control circuit 120 may include one or more adjustable delay lines having delays selected by the DCTL signal that are configured to delay the counter signal values by the same delay as the delay applied to the PCLK signal to provide the LCLK signal. The RSELO control signals may be provided based on the delayed counter signal values. For example, the latch control circuit 120 may include a second decoder that is configured to assert a single one of the RSELO signals with every clock cycle based on the delayed counter signal values. In other embodiments, the RESLI signals may be directly delayed via the one or more adjustable delay lines to provide the RSELO signals.

The RSELI and RSELO signals may be received by the latch circuit 160, and may control propagation of the RP signal to the shifter 180 as the RL signal pulse. The RP signal pulse may be initially received and latched by the latch circuit 160 responsive to an asserted one of the RSELI signals. Subsequently, the latched RP signal may be propagated to the shifter 180 as the RL signal responsive to a corresponding asserted one of the RSELO signals. In response to receiving the combination of the RL signal from the latch circuit 160 and the N signal, the shifter 180 may assert the OER/F signals based on the read latency CL and the N signal. Because the N signal indicates a count of the tCK that have elapsed between receipt of the CLK signal and the LCLK signal, which is the same tCK count between receipt of the CMD signal and the RL signal, the value of the N signal may be subtracted from the CLK to account for the already elapsed tCK. Responsive to assertion of the OER/F signals, the output driver 190 may provide the IDATA as data DQ relative to the timing of the LCLK, and as required by the specified latency CL.

The latch control circuit 120 that times the RSELI and RSELO relative to a single counter may save complexity and improve reliability as compared with coordinating timing of the RSELI and RSELO signals between two different counters. Additional delay models that unnecessarily consume extra chip space are thereby reduced by utilizing the RSELI and RSELO signals that can be provided directly to the latch circuit 160. High speed operations may be better achieved by utilizing a clock-based control system such as the latency control circuit 112.

Figure 2:
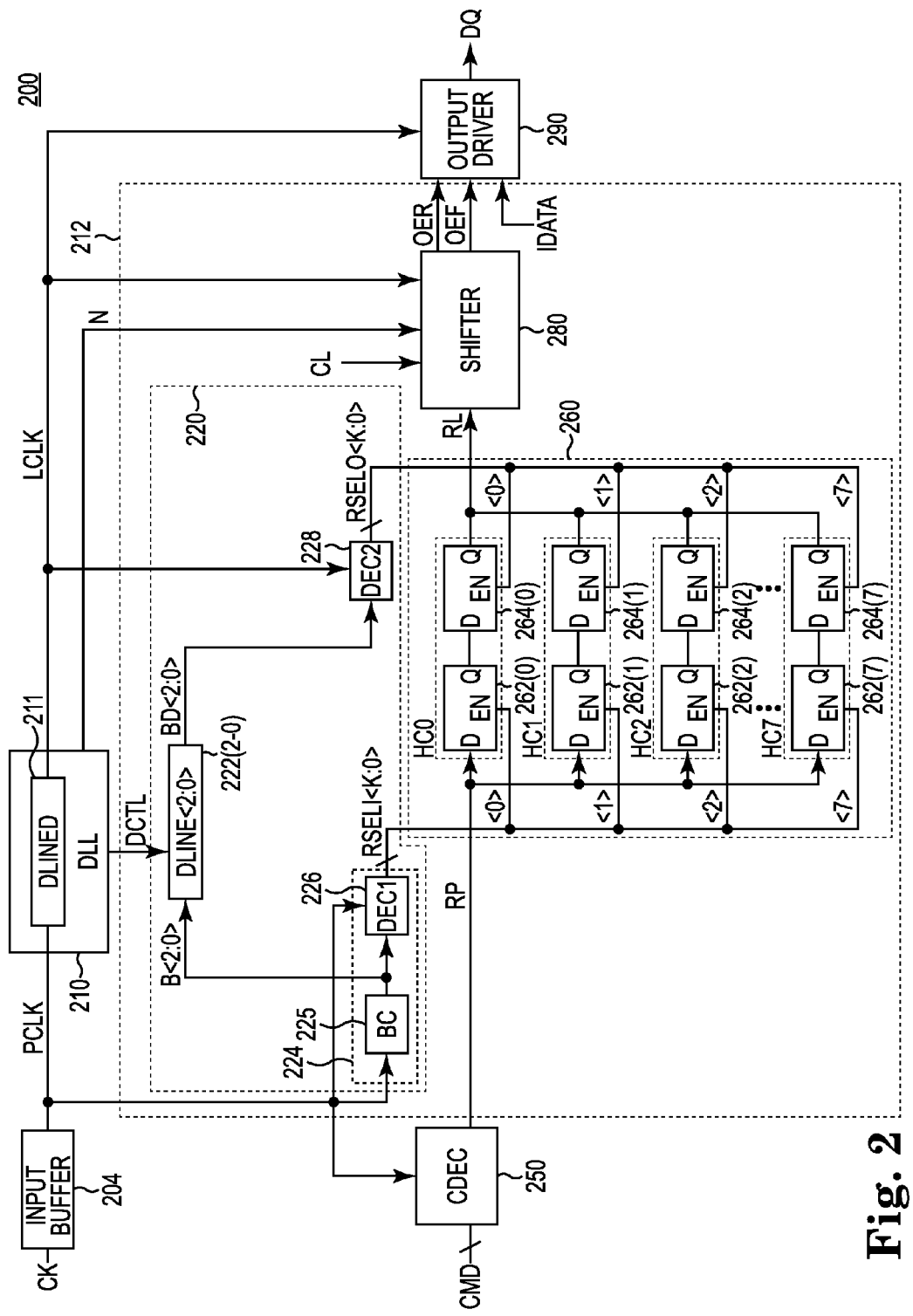
FIG. 2 is a block diagram of an apparatus that includes a latency control circuit according to an embodiment of the disclosure.

Referring to FIG. 2, a particular illustrative embodiment of an apparatus including a latency control circuit 212 is disclosed and generally designated 200. The apparatus 200 may include an input buffer 204 and a DLL 210 configured to receive an external clock signal CLK and to provide an internal clock signal LCLK. The apparatus 200 may further include a command decoder 250 and a latency control circuit 212 configured to receive a command signal CMD and to provide output enable rising OER and output enable falling OEF signals based on timing of receipt of the CMD signal. The 200 may further include an output driver 290 configured to provide the IDATA to a data DQ responsive to the LCLK signal and the OER and OEF signals. The input buffer 204 and the DLL 210 may be implemented in the input buffer 104 and the DLL 110, respectively, of FIG. 1. The command decoder 250 and the latency control circuit 212 may be implemented in the command decoder 150 and the latency control circuit 112, respectively, of FIG. 1.

The DLL 210 may include a delay line DLINED 211 configured to delay the PCLK signal received from the input buffer 204. The DLL 210 may set a delay of the delay line DLINED 211 based on a phase relationship between the PCLK signal and the LCLK signal after passing through circuitry configured to model a propagation path of the CLK signal through the apparatus 200, such as a model of the input buffer 204, the output driver 290, etc. The LCLK signal may be eventually passed on to the output driver 290 after locking is achieved at the DLL 210. The DLL 210 may generate a delay control signal DCTL that adjusts a delay of the delay line DLINED 211 to adjust the timing of the PCLK signal such that the phase of the LCLK will match the phase of the CLK signal at an output of the apparatus 200 (e.g., via the output driver 290). The DLL 210 may also provide a count signal N representing a count of the number of tCK used to adjust the PCLK signal in order to achieve the locked condition (e.g., a tCK latency the CLK signal and the LCLK signal.

The command decoder 250 may be configured to decode the CMD signal respective to the PCLK signal to provide a pulse on the RP signal to the latency control circuit 212. The CMD signal may be a memory access command, such as a read, write, or ODT command. The latency control circuit 212 may include a latch control circuit 220 coupled to a latch circuit 260. The latch control circuit 220 may receive the PCLK signal, the DCTL signal, and the LCLK signal. The latch control circuit 220 may provide control signals RSELI<7:0> and RSELO<7:0> to the latch circuit 260 responsive to the PCLK, DCTL, and LCLK signals. The latch control circuit 220 may include a counter/decoder circuit 224 configured to provide the RESELI<7:0> signals. The counter/decoder circuit 224 may include a counter 225 coupled to a decoder 226. The counter 225 may perform a count operation responsive to the PCLK signal to provide the B<2:0> signals, with each of the B<2:0> signal representing a binary bit of the counter. That is, the counter 225 may increment the B<2:0> signals responsive to the PCLK signal. The B<2:0> signals may indicate a count value ranging from '000' to '111' before wrapping back to '000'. The decoder 226 may decode the B<2:0> signal to assert a corresponding one of the RSELI<7:0> signals responsive to the PCLK signal. That is, each of the RSELI<7:0> signals may correspond to a particular count value indicated by the B<2:0> signals. Responsive to the PCLK signal, may assert the one of the RSELI<7:0> signals corresponding to the decoded count value.

The latch control circuit 220 may further include delay lines DLINE<2:0>222(2-0) coupled between the counter/decoder circuit 224 and a decoder 228. The DLINE<2:0> delay lines 222(2-0) may be configured to delay the B<2:0> signals to provide delayed B<2:0> signals BD<2:0>. The delay of each of the DLINE<2:0> delay lines 222(2-0) may be controlled by the DCTL signal received from the DLL 210. Thus, the delay applied to the B<2:0> signals may be a same delay that is applied to the PCLK signal to generate the LCLK signal. The decoder 228 may receive the BD<2:0> signals and, similar to the decoder 226, may decode the BD<2:0> signals to assert a corresponding one of the RSELO<7:0> signals responsive to the LCLK signal. That is, each of the RSELO<7:0> signals may correspond to a count value of the BD<2:0> signals. Responsive to the LCLK signal, the decoder 228 may assert the one of the RSELO<7:0> signals corresponding to the decoded count value.

The latch circuit 260 may include input latches 262(0-7) and output latches 264(0-7). Each of the input latches 262(0-7) may be coupled in series with a respective one of the output latches 264(0-7) to form input/output latch pairs (e.g., holding circuits HC0-HC7). For example, the input latch 262(0) may be coupled to the output latch 264(0) in series. The input latches 262(0-7) may be clocked by the RSELI<7:0> signals, and the output latches 264(0-7) may be clocked by the RSELO<7:0> signals. The input latches 262(0-7) may be configured to receive the RP signal from the command decoder 250 and one of the input latches 262(0-7) may latch the RP signal pulse responsive to the corresponding RSELI<7:0> signal. Further, the output latches 264(0-7) associated with the input latch 262(0-7) that has latched the RP signal pulse may latch the latched RP signal pulse as the RL signal responsive to the corresponding RSELO<7:0> signal.

The latency control circuit 212 may further include a shifter 280 configured to receive the RL signal pulse from the latch circuit 260 and a count signal N and the LCLK signal from the DLL 210. The shifter 280 may assert the OER and OEF signals responsive to receipt of the RL signal pulse and based on subtracting the N signal from the read latency CL. The output driver 290 may receive the asserted OER and OEF signals, the LCLK signal, and input data IDATA, and may propagate the IDATA to DQ responsive to the asserted OER and OEF signals and the LCLK signal.

In operation, the apparatus 200 may receive (e.g., from a memory controller) the external CLK signal at the input buffer 204 and the CMD signal at the command decoder 250 based on timing of the PCLK signal. When the CMD signal includes a read command, the apparatus 200 may operate according to the read latency CL. The DLL 210 and the latency control circuit 212 may be configured to apply the latency CL to the IDATA and synchronize the IDATA with the CLK signal.

The DLL 210 may receive the PCLK signal from the input buffer 204. The delay line DLINED 211 may delay the PCLK signal to provide the LCLK signal based on the DCTL signal. The delay selected by the DCTL signal may be based on a phase relationship between the PCLK signal and the LCLK signal passed through a model delay. The DLL 210 may determine a tCK latency between the CLK signal and the LCLK signal, and may provide the N signal having a value indicating the tCK latency. The N signal may be used by the shifter 280 to determine when to assert the OER and OEF signals.

The command decoder 250 may decode the CMD signal responsive to the PCLK signal and provide a pulse on the RP signal to the latch circuit 260. The PCLK and LCLK signals may be received by the latch control circuit 220 and used to change timings of read command pulses from being relative to the PCLK to being relative to the LCLK clock during a memory read operation.

For example, the counter 225 may receive the PCLK signal, and may increment a count with every clock cycle of the PCLK signal to provide the B<2:0> signals, where each of the B<2:0> represents a bit of the counter. The decoder 226 may decode the B<2:0> signals to assert a respective one of the RSELI<7:0> signals responsive to the PCLK signal. As the collective value of the B<2:0> signals change with each clock cycle of the PCLK, a different one of the RSELI<7:0> signals may be asserted with each clock cycle of the PCLK signal. For example, when the B<2:0> signals have logical values of '000', the RSELI<0> signal may be asserted, and when the B<2:0> signals have logical values of '001', the RSELI<1> signal may be asserted, etc.

The B<2:0> may also be provided to the delay lines DLINE<2:0>222(2-0). The delay lines DLINE<2:0>222(2-0) may delay the B<2:0> signals to provide the BD<2:0> signals. Similar to the decoder 226, the decoder 228 may decode the BD<2:0> signals to assert a respective one of the RSELO<7:0> signals responsive to the LCLK signal. The delay of the delay lines DLINE<2:0>222(2-0) may be selected based on the DCTL signal. The delay lines DLINE<2:0>222(2-0) may be identical to the delay line DLINED 211, and thus the DCTL signal may select the same delay for the B<2:0> signals as the delay applied to the PCLK signal. Based on having the same applied delay, the latency between the B<2:0> signals and the BD<2:0> signals may be the same as the latency between the PCLK and LCLK signals. Accordingly, the latency between the one of the RSELI<7:0> signals asserted based on the B<2:0> signals and the corresponding one of the RSELO<7:0> signals asserted based on the BD<2:0> signals may be the same as the latency between the PCLK and LCLK signals. By using a single counter 225 as a basis to assert the RSELI<7:0> and RSELO<7:0> signals (e.g., rather than separate counters for each), a synchronous relationship between the RSELI<7:0> and RSELO<7:0> signals may be inherently maintained. For example, if controlled by separate counters, the counters for each may become asynchronous relative to one another, and would thus require a reset to be re-synchronized.

The RSELI<7:0> and RSELO<7:0> signals may be received by the latch circuit 260, and may control propagation of the RP signal pulse to the shifter 280 via the RL signal. For example, the RP signal pulse may be received at an input of each of the input latches 262(0-7). After receipt of the RP signal pulse at the inputs of the input latches 262(0-7), a first one of the RSELI<7:0> to be asserted may clock a corresponding input latch 262(0-7) to latch the RP signal pulse therein. As previously described, the RSELI<7:0> signals may be sequentially asserted based on timing of the PCLK signal and the B<2:0> signals. Thus, each of the input latches 262(0-7) may be asserted once every 8 tCK of the PCLK signal in a round robin fashion. The latched RP signal pulse may be held in the one input latch 262(0-7) and provided to an output of the one input latch 262(0-7). After latching of the RP signal pulse by the one input latch 262(0-7), an output latch of the output latches 264(0-7) corresponding to the input latch that latched the RP signal pulse may latch the latched RP signal pulse and provide the latched RP signal pulse to an output as the RL signal responsive to a corresponding RSELO<7:0> signal. Because the timing relationship between corresponding RSELI<7:0> signals and RSELO<7:0> signals is equal to the timing relationship between the PCLK and LCLK signals, the timing relationship between the RP and RL signals is also equal to the latency between the PCLK and LCLK signals.

Responsive to receipt of the RL signal pulse, the shifter 280 may assert the OER and OEF signals based on the read latency CL. The shifter 280 may subtract the N signal value (e.g., elapsed time from receipt of the CMD signal to latching of the RL signal) plus 1 tCK (e.g., to allow 1 tCK for the output driver 290 to latch the IDATA) from the read latency CL, and may delay assertion of the OER and OEF signals responsive to the LCLK signal based on the calculation. After the delay, the shifter 280 may assert the OER and OEF signals. Responsive to receiving the asserted OER and OEF signals, the output driver 290 may provide the IDATA data to the data DQ responsive to the LCLK signal. The data DQ may provide the IDATA data to a data bus having timing synchronized with the CLK signal.

While FIG. 2 depicts the latch circuit 260 having 8 pairs of input 262(0-7)/output latches 264(0-7), the latch circuit 260 may have more or less than 8 pairs of latches. Accordingly, the number of bits in the counter 225 and the size of the decoder 226 and decoder 228 may vary based on the number of pairs of input/output latches of the latch circuit 260. For example, with 16 input/output latch pairs, the counter 225 may be a 4-bit decoder, and the decoder 226 and decoder 228 may be 16 bit decoders. The number of delay lines of the delay lines DLINE<2:0> 222(2-0) may be based on the number of bits in the counter 225.

Figure 3:
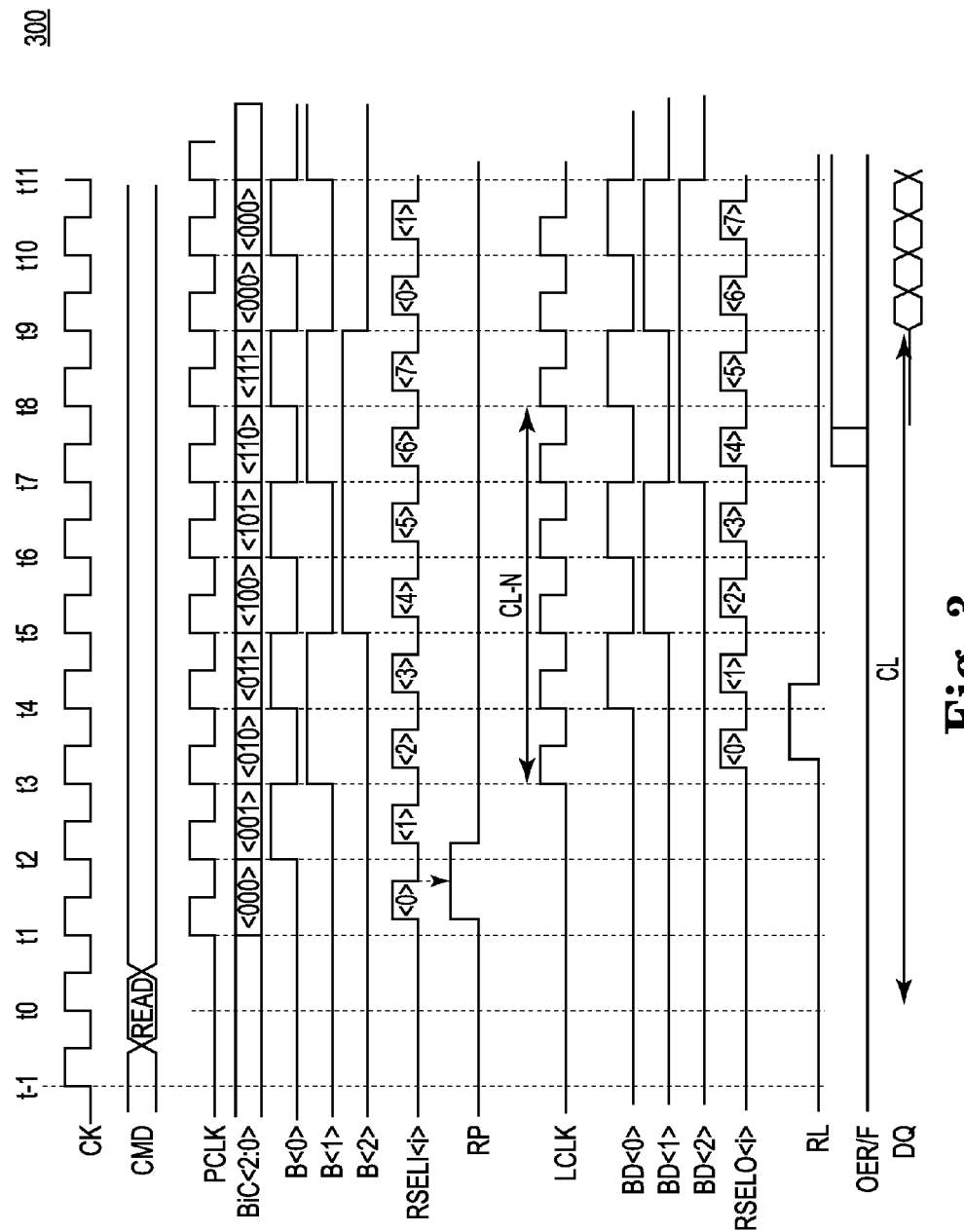
FIG. 3 is a timing diagram of various signals during operation of the latency control circuit according to an embodiment of the disclosure.

FIG. 3 is an exemplary timing diagram depicting various signals propagating through circuitry of the apparatus 200 of FIG. 2. The CLK signal may represent a CLK signal received at the input buffer 204 of FIG. 2. The CMD signal may represent the CMD signal received at the command decoder 250 of FIG. 2. The PCLK signal may represent a PCLK signal provided by the input buffer 204 of FIG. 2. The B<2:0> signals may represent the B<2:0> signals provided by the counter 225 of FIG. 2. The RSELI<i> signal may represent the RSELI<7:0> signals provided by the decoder 226 of FIG. 2. The RP signal may represent the RP signal provided by the command decoder 250 of FIG. 2. The LCLK signal may represent a LCLK signal provided by the DLL210 of FIG. 2. The BD<2:0> signals may represent the BD<2:0> signals received by the decoder 228 of FIG. 2. The RSELO<i> signal may represent the RSELO<7:0> signals provided by the decoder 228 of FIG. 2. The RL signal may represent the RL signal provided by the latch circuit 260 of FIG. 2. The OER/F signals may represent the OER and OEF signals provided by the shifter 280 of FIG. 2. The DQ may represent the data DQ providing from the output driver 290 of FIG. 2.

At time t0, a READ command may be received at the apparatus 200 via the CMD signal coincident with a rising edge of the CLK signal received at the input buffer 204. At time t1, the PCLK signal may be provided at an output of the input buffer 204. Coincident with the PCLK, the counter 225 may begin counting, thus toggling the B<2:0> signals starting from time t1. The decoder 226 may assert one of the RSELI<7:0> signals based on a value of the B<2:0> signals. For example, responsive to the PCLK signal, the RSELI<0> signal may be asserted when the B<2:0> has values of '000' between time t1 and time t2. The RP signal may be asserted from the command decoder 250 starting between time between time t1 and t2, and may be de-asserted after time t2 (e.g., a pulse). Responsive to the RSELI<0> signal being asserted in this example between times t1 and t2, the RP signal may be latched at the input latch 262(0).

At time t3, the LCLK signal may start. Thus, the tCK count of the N signal may be equal to 3 tCK (e.g., time from receipt of read command to start of the LCLK signal). Coincident with the LCLK starting, the decoder 228 may begin receiving and decoding the BD<2:0> signals to assert the RSELO<7:0> signals. For example, responsive to the LCLK signal, the RSELO<0> signal may be asserted when the BD<2:0> has values of '000' between time t3 and time t4. Responsive to the RSELO<0> signal being asserted in this example between times t3 and t4, the latched RP signal pulse may be latched as the RL signal at the output latch 264(0). Thus, using the latency control circuit 212 of FIG. 2, the latency between of the RP and RL signals may match the latency between the PCLK and LCLK signals.

The shifter 280 may receive the RL signal pulse, along with the N signal, and begin counting a delay based on the read latency. The shifter may apply a delay that equal to the read latency CL minus the N value (e.g., 3tCK) minus 1. Thus, between times t7 and t8, the OER/F signals may be asserted. Responsive to the OER/OEF signals being asserted, the output driver may begin providing data at an output responsive to the LCLK signal at time t9. In this example, the read latency CL is equal to 9 tCK. Other read latencies CL may be used in other apparatuses.

The timing diagram 300 is exemplary, and actual relative timing relationships between signals may vary from the relationships depicted. Further, the length of pulses of signals of the timing diagram 300 may vary from depicted.

Figure 4:
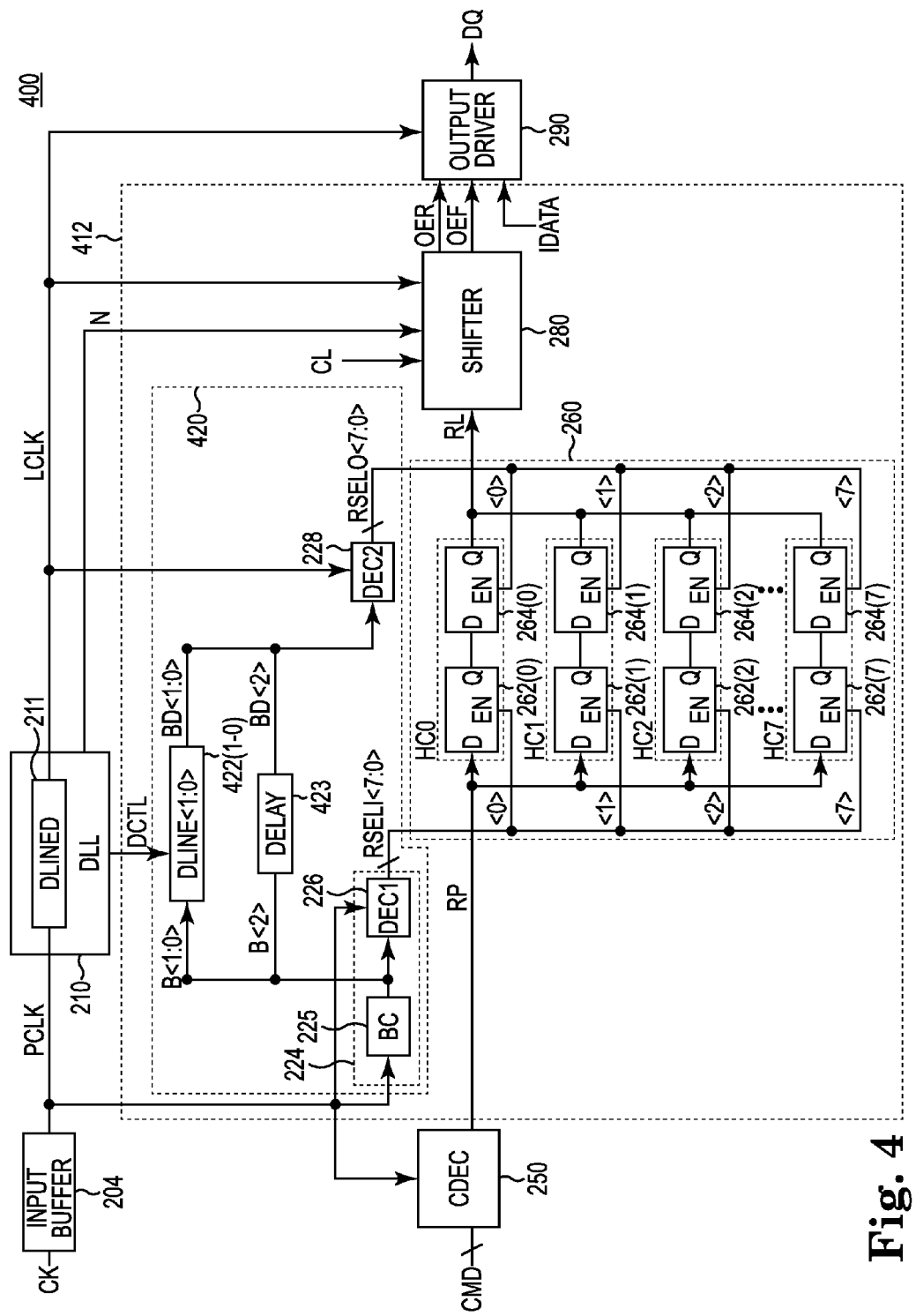
FIG. 4 is a block diagram of an apparatus that includes a latency control circuit according to an embodiment of the disclosure.

Referring to FIG. 4, a particular illustrative embodiment of an apparatus including a latency control circuit 412 is disclosed and generally designated 400. The apparatus 400 may include an input buffer 204 and a DLL 210 configured to receive an external clock signal CLK and to provide an internal clock signal LCLK. The apparatus 400 may further include a command decoder 250 and a latency control circuit 412 configured to receive a command signal CMD and to provide output enable rising OER and output enable falling OEF signals based on timing of receipt of the CMD signal. The 400 may further include an output driver 290 configured to provide the IDATA as DQ data responsive to the LCLK signal and the OER and OEF signals. The latency control circuit 212 may be implemented in the latency control circuit 112 of FIG. 1. The apparatus 400 may include elements that have been previously described with respect to the apparatus 200 of FIG. 2. Those elements have been identified in FIG. 4 using the same reference numbers used in FIG. 2 and operation of the common elements is as previously described. Consequently, a detailed description of the operation of these particular elements will not be repeated in the interest of brevity.

The command decoder 250 may be configured to decode the CMD signal to provide a decoded command signal RP to the latency control circuit 412. The latency control circuit 412 may include a latch control circuit 420 coupled to the latch circuit 260. The latch control circuit 420 may receive the PCLK signal, the DCTL signal, and the LCLK signal. The latch control circuit 420 may provide control signals RSELI<7:0> and RSELO<7:0> to the latch circuit 260 responsive to the PCLK, DCTL, and LCLK signals. The latch control circuit 420 may include the counter/decoder circuit 224 configured to provide the RSELI<7:0> signals.

The latch control circuit 420 may further include delay lines DLINE<1:0> 422(1-0) coupled between the counter/decoder circuit 224 and the decoder 228. The DLINE<1:0> delay lines 422(1-0) may be configured to delay the B<1:0> signals to provide delayed B<1:0> signals BD<1:0>. The delay of each of the DLINE<1:0> delay lines 422(1-0) may be controlled by the DCTL signal received from the DLL 210. Thus, the delay applied to the B<1:0> signals may be a same delay that is applied to the PCLK signal to generate the LCLK signal. The latch control circuit 420 may further include delay 423 coupled between the counter/decoder circuit 224 and the decoder 228. The delay 423 may be configured to delay the B<2> signal to provide delayed B<2> signals BD<2>. The delay the delay 423 may be fixed. Because the B<2> signal is associated with the most significant bit of the counter 225 and only transitions 4 tCK, and because the RSELO<0:7> signals transition responsive to the LCLK signal, using the delay 423 in place of an adjustable delay line may reduce complexity and layout size while retaining the benefits of timing control using the latch circuit 260.

In operation, as previously described, the counter 225 may provide the B<2:0> signals and the decoder 226 may decode the B<2:0> signals to assert a respective one of the RSELI<7:0> signals responsive to the PCLK signal. The B<1:0> signals may also be provided to the delay lines DLINE<1:0>422(1-0) and the B<2> signal may be provided through the delay 423. The delay lines DLINE<1:0> 422 (1-0) may delay the B<1:0> signals to provide the BD<1:0> signals based on the DCTL signal. The delay lines DLINE<1:0> 422(1-0) may be identical to the delay line DLINED 211, and thus the DCTL signal may select the same delay for the B<1:0> signals as the delay applied to the PCLK signal. The delay 423 may apply a fixed delay to the B<2> signal to provide the BD<2> signal. Based on having the same applied delay, the latency between the B<1:0> signals and the BD<1:0> signals may be the same as the latency between the PCLK and LCLK signals, and latency between the B<2> signal and the BD<2> signal may have a different latency. However, because the RSELO<7:0> signals are asserted responsive to the LCLK signal, the exact timing of receipt of the BD<2> signal relative to timing of receipt of the BD<1:0> signals may vary slightly (e.g., within one tCK) with no noticeable difference in the behavior of the RSELO<7:0> signals. Further, the BD<2> signal is the most significant bit of the count, so the signal may only toggles once every 4 tCK, thereby reducing an opportunity for error. By replacing an adjustable delay line with a fixed delay, the layout size and complexity may be reduced.

As previously described, the RSELI<7:0> and RSELO<7:0> signals may be received by the latch circuit 260, and may control propagation of the RP signal to the shifter 280 as the RL signal. Responsive to receipt of the RL signal, the shifter 280 may assert the OER and OEF signals based on the read latency CL. Responsive to receiving the asserted OER and OEF signals, the output driver 290 may provide the IDATA data to the DQ responsive to the LCLK signal. The DQ may provide the IDATA data to a data bus having timing synchronized with the CLK signal.

As previously described with reference to FIG. 2, the number of bits in the counter 225 may be based on the number of input/output latch pairs of the latch circuit 260. Thus, it will be appreciated that the number of delay lines of the delay lines DLINE<1:0> 422(1-0) may be based on the number of bits in the counter 225 (e.g., count of bits in the counter 225−1).

Figure 5:
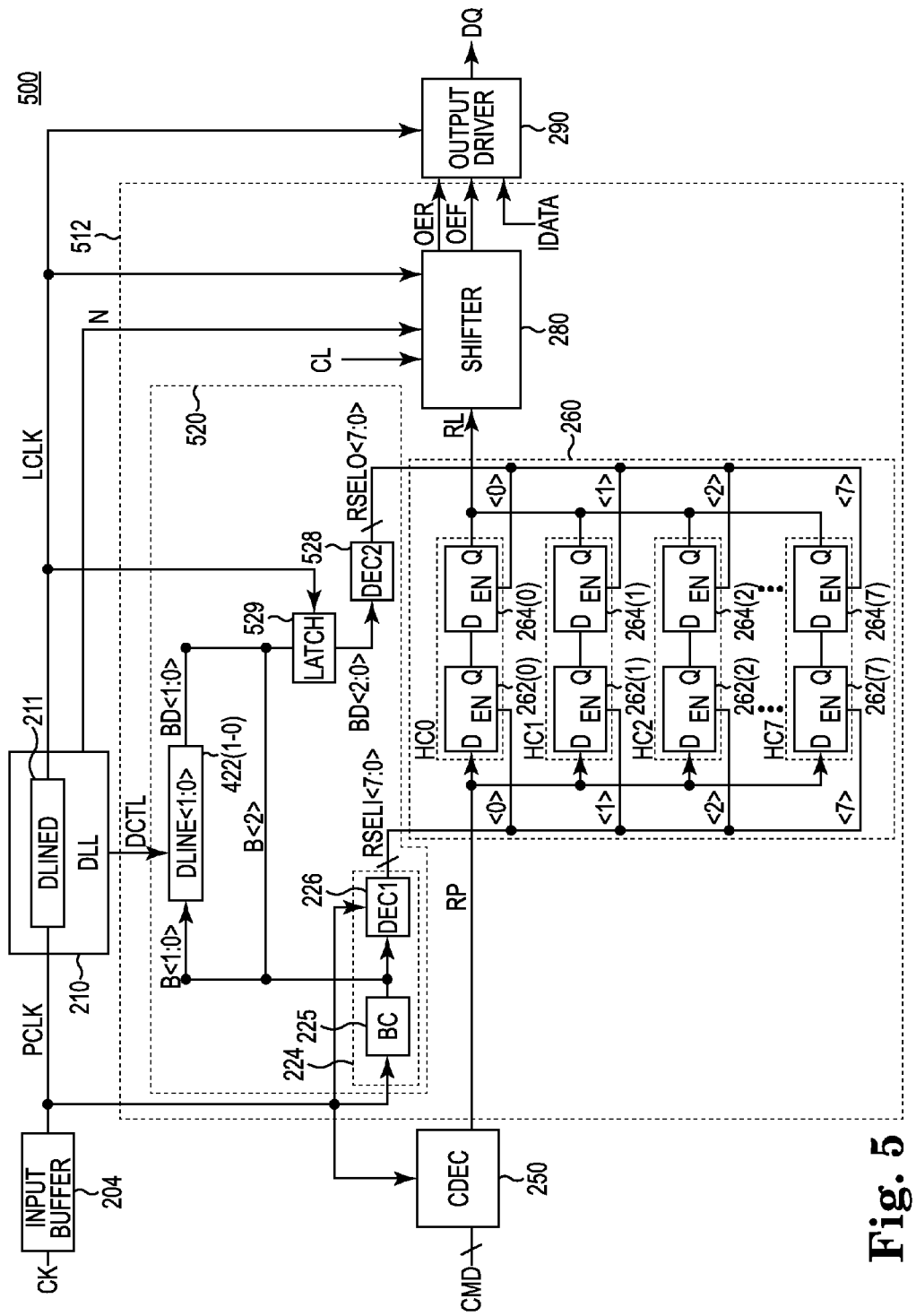
FIG. 5 is a block diagram of an apparatus that includes a latency control circuit according to an embodiment of the disclosure.

Referring to FIG. 5, a particular illustrative embodiment of an apparatus including a latency control circuit 512 is disclosed and generally designated 500. The apparatus 500 may include an input buffer 204 and a DLL 210 configured to receive an external clock signal CLK and to provide an internal clock signal LCLK. The apparatus 500 may further include a command decoder 250 and a latency control circuit 512 configured to receive a command signal CMD and to provide output enable rising OER and output enable falling OEF signals based on timing of receipt of the CMD signal. The 500 may further include an output driver 290 configured to provide the IDATA as DQ data responsive to the LCLK signal and the OER and OEF signals. The latency control circuit 512 may be implemented in the latency control circuit 112 of FIG. 1. The apparatus 500 may include elements that have been previously described with respect to the apparatus 200 of FIG. 2 and the apparatus 400 of FIG. 4. Those elements have been identified in FIG. 5 using the same reference numbers used in FIG. 2 and/or in FIG. 4, and operation of the common elements is as previously described. Consequently, a detailed description of the operation of these particular elements will not be repeated in the interest of brevity.

The command decoder 250 may be configured to decode the CMD signal to provide a decoded command signal RP to the latency control circuit 512. The latency control circuit 512 may include a latch control circuit 520 coupled to the latch circuit 260. The latch control circuit 520 may receive the PCLK signal, the DCTL signal, and the LCLK signal. The latch control circuit 520 may provide control signals RSELI<7:0> and RSELO<7:0> to the latch circuit 260 responsive to the PCLK, DCTL, and LCLK signals. The latch control circuit 520 may include the counter/decoder circuit 224 configured to provide the RESELI<7:0> signals.

The latch control circuit 520 may further include delay lines DLINE<1:0> 422(1-0) coupled between the counter/decoder circuit 224 and a latch 529. The DLINE<1:0> delay lines 422(1-0) may be configured to delay the B<1:0> signals to provide delayed B<1:0> signals BD<1:0>. The latch control circuit 520 may not apply any delay to the B<2> signal. The latch control circuit 520 may further include a latch 529 that is configured to receive the BD<1:0> signals from the delay lines DLINE<1:0> 422(1-0) and the B<2> signal directly from the counter/decoder circuit 224. The latch 529 may be clocked by the LCLK to latch the BD<1:0> and B<2> signals at an output as the BD<2:0> signals. That is, the latch 529 may recombine the B<2:0> signals at an output as the BD<2:0> signals.

The 528 may receive the BD<2:0> signals and may decode the BD<2:0> signals to assert a corresponding one of the RSELO<7:0> signals. Thus, each of the RSELO<7:0> signals may correspond to a count value of the BD<2:0> signals. The 528 may assert the one of the RSELO<7:0> signals corresponding to the decoded count value.

In operation, as previously described, the counter 225 may provide the B<2:0> signals and the decoder 226 may decode the B<2:0> signals to assert a respective one of the RSELI<7:0> signals responsive to the PCLK signal. The B<1:0> signals may also be provided to the delay lines DLINE<1:0> 422(1-0) to provide the BD<2:0> signals to the latch 529. The latch 529 may also receive the B<2> signal directly from the counter/decoder circuit 224. The latch 529 may latch the BD<1:0> and the B<2> signals at an output as the BD<2:0> signals. The 528 may decode the BD<2:0> signals to assert a respective one of the RSELO<7:0> signals responsive to the LCLK signal. Because the BD<2:0> signals are collectively provided to the 528 responsive to the LCLK signal, the exact timing of receipt of the B<2> signal at the latch 529 relative to timing of receipt of the BD<1:0> signals may vary slightly (e.g., within one tCK) with no noticeable difference in the behavior of the RSELO<7:0> signals provided from the 528. Further, the BD<2> signal is the most significant bit of the count, so the signal may only toggles once every 4 tCK, thereby reducing an opportunity for error. By replacing an adjustable delay line with latch, the layout size and complexity may be reduced.

As previously described, the RSELI<7:0> and RSELO<7:0> signals may be received by the latch circuit 260, and may control propagation of the RP signal to the shifter 280 as the RL signal. Responsive to receipt of the RL signal, the shifter 280 may assert the OER and OEF signals based on the read latency CL. Responsive to receiving the asserted OER and OEF signals, the output driver 290 may provide the IDATA data to the DQ responsive to the LCLK signal. The DQ may provide the IDATA data to a data bus having timing synchronized with the CLK signal.

As previously described with reference to FIG. 2, the number of bits in the counter 225 may be based on the number of input/output latch pairs of the latch circuit 260. Thus, it will be appreciated that the size of the latch 529 may be based on the number of bits in the counter 225 (e.g., count of bits in the counter 225).

Figure 6:
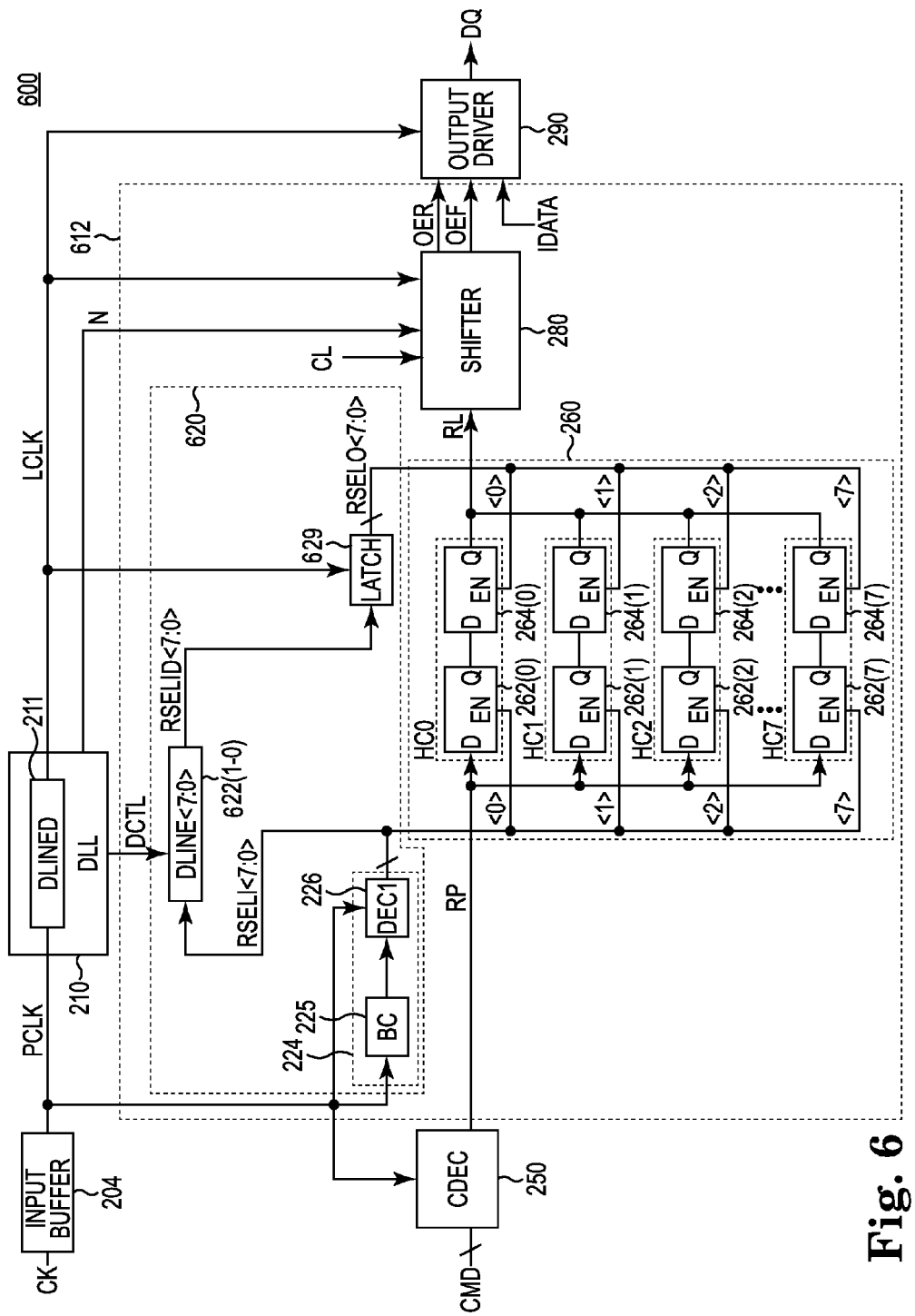
FIG. 6 is a block diagram of an apparatus that includes a latency control circuit according to an embodiment of the disclosure.

Referring to FIG. 6, a particular illustrative embodiment of an apparatus including a latency control circuit 612 is disclosed and generally designated 600. The apparatus 600 may include an input buffer 204 and a DLL 210 configured to receive an external clock signal CLK and to provide an internal clock signal LCLK. The apparatus 600 may further include a command decoder 250 and a latency control circuit 612 configured to receive a command signal CMD and to provide output enable rising OER and output enable falling OEF signals based on timing of receipt of the CMD signal. The 600 may further include an output driver 290 configured to provide the IDATA as DQ data responsive to the LCLK signal and the OER and OEF signals. The latency control circuit 612 may be implemented in the latency control circuit 112 of FIG. 1. The apparatus 600 may include elements that have been previously described with respect to the apparatus 200 of FIG. 2. Those elements have been identified in FIG. 6 using the same reference numbers used in FIG. 2, and operation of the common elements is as previously described. Consequently, a detailed description of the operation of these particular elements will not be repeated in the interest of brevity.

The command decoder 250 may be configured to decode the CMD signal to provide a decoded command signal RP to the latency control circuit 612. The latency control circuit 612 may include a latch control circuit 620 coupled to the latch circuit 260. The latch control circuit 620 may receive the PCLK signal, the DCTL signal, and the LCLK signal. The latch control circuit 620 may provide control signals RSELI<7:0> and RSELO<7:0> to the latch circuit 260 responsive to the PCLK, DCTL, and LCLK signals. The latch control circuit 620 may include the counter/decoder circuit 224 configured to provide the RESELI<7:0> signals.

The latch control circuit 620 may further include delay lines DLINE<7:0> 622(7-0) coupled between the counter/decoder circuit 224 and a latch 629. The DLINE<7:0> delay lines 622(7-0) may be configured to delay the RSELI<7:0> signals to provide delayed RSELI<7:0> signals RSELID<7:0>. The delay of each of the DLINE<7:0> delay lines 622(7-0) may be controlled by the DCTL signal received from the DLL 210. Thus, the delay applied to the RSELI<7:0> signals may be a same delay that is applied to the PCLK signal to generate the LCLK signal. The latch control circuit 620 may further include the latch 629 that is configured to receive the RSELID<7:0> signals from the delay lines DLINE<7:0> 622(7-0). The latch 629 may be clocked by the LCLK to latch the RSELID<7:0> at an output as the RSELO<7:0> signals. Thus, rather than decoding the B<2:0> signals after a delay, the delay may be applied directly to the RSELI<7:0> signals, via the delay lines DLINE<7:0> 622(7-0), and the decoder may be replaced with a simple latch 629 to provide the RSELO<7:0> signals responsive to the LCLK signal.

In operation, as previously described, the counter 225 may provide the B<2:0> signals and the decoder 226 may decode the B<2:0> signals to assert a respective one of the RSELI<7:0> signals responsive to the PCLK signal. The RSELI<7:0> signals may also be provided to the delay lines DLINE<7:0> 622(7-0). The delay lines DLINE<7:0> 622(7-0) may delay the RSELI<1:0> signals to provide the RSELID <7:0> signals based on the DCTL signal. The delay lines DLINE<7:0> 622(7-0) may be identical to the delay line DLINED 211, and thus the DCTL signal may select the same delay for the RSELI<7:0> signals as the delay applied to the PCLK signal. Based on having the same applied delay, the latency between the RSELI<7:0> signals and the RSELID<7:0> signals may be the same as the latency between the PCLK and LCLK signals. The RSELID<7:0> signals may be provided to the latch 629. The latch 629 may latch the RSELID<7:0> signals at an output as the RSELO<7:0> signals. Rather than decoding the B<2:0> signals after a delay, the delay may be applied directly to the RSELI<7:0> signals, via the delay lines DLINE<7:0> 622

(7-0), and the decoder may be replaced with a simple latch 629 to provide the RSELO<7:0> signals responsive to the LCLK signal.

As previously described, the RSELI<7:0> and RSELO<7:0> signals may be received by the latch circuit 260, and may control propagation of the RP signal to the shifter 280 as the RL signal. Responsive to receipt of the RL signal, the shifter 280 may assert the OER and OEF signals based on the read latency CL. Responsive to receiving the asserted OER and OEF signals, the output driver 290 may provide the IDATA data to the DQ responsive to the LCLK signal. The DQ may provide the IDATA data to a data bus having timing synchronized with the CLK signal.

As previously described with reference to FIG. 2, the latch circuit 260 may have more or less than 8 pairs of input/output latches. Accordingly, the size of the latch 629 may vary based on the number of pairs of input/output latches of the latch circuit 260. For example, with 16 input/output latch pairs, the latch 629 may be a 16 bit latch. Further, the number of delay lines of the delay lines DLINE<7:0> 622(7-0) may also be based on the number of pairs of input/output latches.

Figure 7:
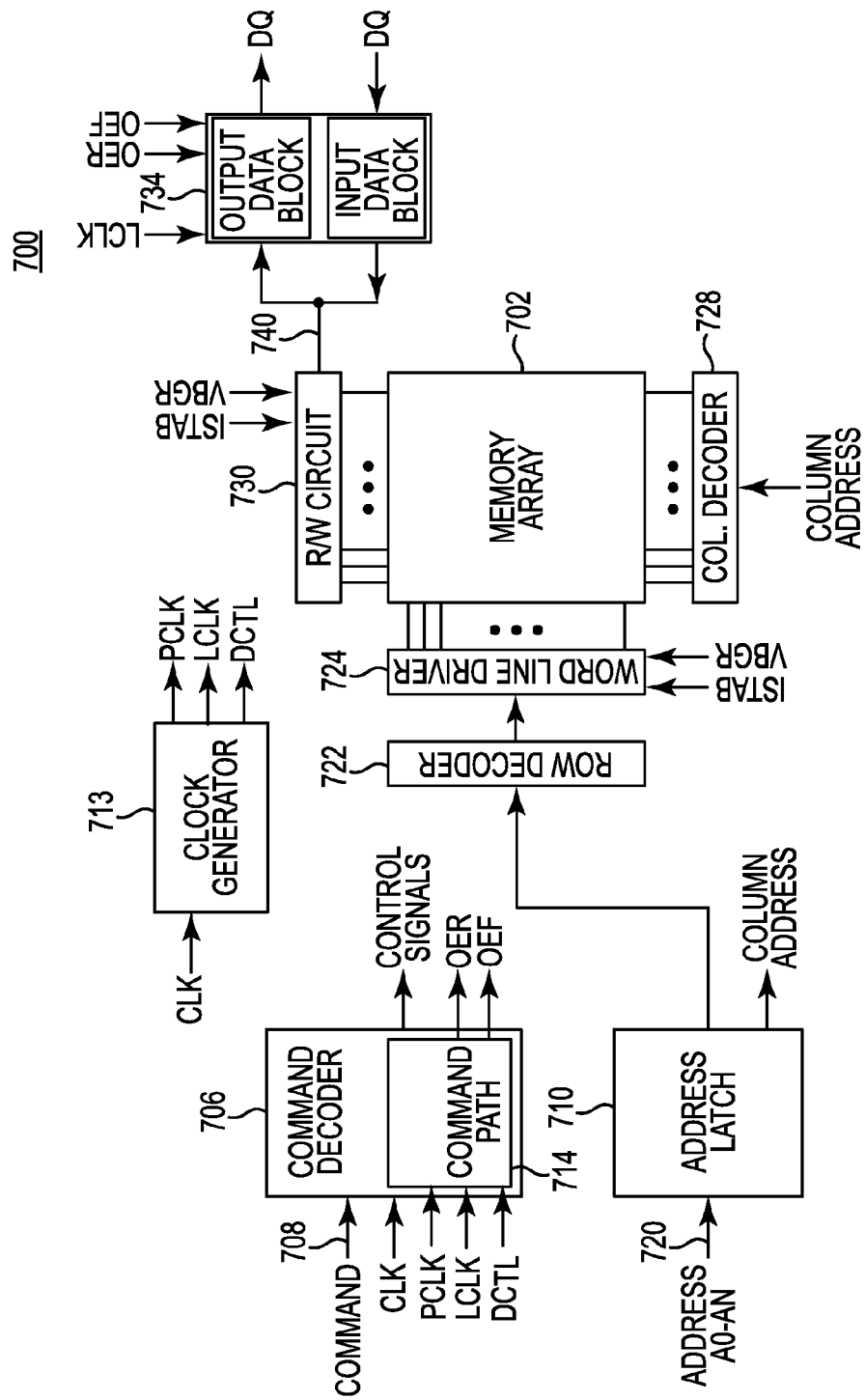
FIG. 7 is a block diagram of a memory including a latency control circuit according to an embodiment of the disclosure.

Referring to FIG. 7, block diagram of a memory 700 including a delay line circuit according to an embodiment of the disclosure. The memory 700 may include an array 702 of memory cells, which may be, for example, dynamic random-access memory (DRAM) memory cells, static random-access memory (SRAM) memory cells, flash memory cells, or some other types of memory cells. The memory 700 may include clock generator 713 that is configured to generate receive the CLK signal, and to generate internal clock signals PCLK and LCLK. The clock generator may include a DLL circuit that includes an adjustable delay circuit configured to generate the LCLK signal based on the PCLK signal. The delay of the adjustable delay circuit may be selected by the DCTL signal. The clock generator 713 may include the input buffer 104 and/or the DLL 110 of FIG. 1, the input buffer 204 and/or the DLL 210 of FIGS. 2, 4, 5, and/or 6, or combinations thereof.

The memory 700 includes a command decoder 706 that may receive memory commands through a command bus 708 and provide (e.g., generate) corresponding control signals within the memory 700 to carry out various memory operations. The command decoder 706 may include a command path 714 configured to control timing of the received CMD signal. The command path 714 may receive the PCLK, LCLK, and DCTL signals from the clock generator 713, and may generate the output enable rising OER and output enable falling OEF signals responsive to the PCLK, LCLK, DCTL, and CMD signals. The command path 714 may include the latency control circuit 112 of FIG. 1, the latency control circuit 212 of FIG. 2, the latency control circuit 412 of FIG. 4, the latency control circuit 512 of FIG. 5, and/or the latency control circuit 612 of FIG. 6.

Row and column address signals may be provided (e.g., applied) to an address latch 710 in the memory 700 through an address bus 720. The address latch 710 may then provide (e.g., output) a separate column address and a separate row address. The address latch 710 may provide row and column addresses to a row address decoder 722 and a column address decoder 728, respectively. The column address decoder 728 may select bit lines extending through the array 702 corresponding to respective column addresses. The row address decoder 722 may be connected to a word line driver 724 that activates respective rows of memory cells in the array 702 corresponding to received row addresses. The selected data line (e.g., a bit line or bit lines) corresponding to a received column address may be coupled to a read/write circuitry 730 to provide read data to an output data buffer 734 via an input-output data bus 740. The output data buffer 734 may provide the read data to the DQ responsive to the OER, OEF, and LCLK signals. Write data may be provided to the memory array 702 through an input data buffer 744 and the memory array read/write circuitry 730. The command decoder 706 may respond to memory commands provided to the command bus 708 to perform various operations on the memory array 702. In particular, the command decoder 706 may be used to provide internal control signals to read data from and write data to the memory array 702.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a counter circuit configured to receive a first clock signal and produce a plurality of first signals responsive to the first clock signal;
a delay circuit coupled to the counter circuit and configured to provide a plurality of second signals by delaying the plurality of first signals; and
a latch circuit configured including a plurality of holding circuits, wherein an input of each of the plurality of holding circuits is coupled to a first circuit node and an output of each of the plurality of holding circuits is coupled to a second circuit node, wherein individual ones of the plurality of holding circuits are configured to latch an input signal on the first circuit node responsive to an assertion of a respective one of a plurality of input enable signals, wherein the individual ones of the plurality of holding circuits are further configured to output an output signal to the second circuit node responsive to an assertion of a respective one of a plurality of output enable signals, wherein individual ones of the plurality of input enable signals are asserted based on at least one of the plurality of first signals and individual ones of the plurality of output enable signals are asserted based on at least one of the plurality of second signals.

2. The apparatus of claim 1, wherein the counter circuit is configured to perform a counting operation responsive to the first clock signal to provide the plurality of first signals, wherein individual ones of the plurality of first signals indicate a respective bit value associated with the counting operation, the apparatus further comprising:
- a first decoder circuit coupled to the counter and configured to provide the plurality of input enable signals based on the plurality of first signals; and
- a second decoder circuit coupled to the delay circuit and configured to provide the plurality of output enable signals based on the plurality of second signals.

3. The apparatus of claim 2, wherein the delay circuit comprises a plurality of delay line circuits, wherein a delay line circuit of the plurality of delay line circuits is configured to delay one of plurality of first signals to provide one of the plurality of second signals.

4. The apparatus of claim 3, further comprising a clock generation circuit that includes a first delay line circuit, the first delay line circuit configured to receive the first clock signal and provide a second clock signal by delaying the first clock signal, the clock generation circuit configured to provide delay control information, and wherein a delay applied by one or more of the plurality of delay line circuits is substantially equal to a delay applied by the first delay circuit.

5. The apparatus of claim 4, wherein a delay applied by one of the plurality of delay line circuits is different than a delay applied by the first delay circuit.

6. The apparatus of claim 4, wherein the clock generation circuit includes a delay-locked loop circuit.

7. An apparatus comprising:
- a first delay line circuit configured to delay a clock signal to provide a delayed clock signal;
- a latch control circuit configured to receive the clock signal and the delayed clock signal, wherein, responsive to the clock signal, the latch control circuit is configured to provide a first plurality of control signals based on a count associated with the first clock signal, wherein, responsive to the delayed clock signal, the latch control circuit is further configured to provide a second plurality of control signals based on the count associated with the first clock signal, wherein the second plurality of control signals are delayed relative to the first plurality of control signals by an amount substantially equal to a delay between the clock signal and the delayed clock signal; and
- a latch circuit configured to latch an input signal responsive to one of the first plurality of control signals; the latch circuit further configured to provide the latched input signal to an output responsive to one of the second plurality of control signals.

8. The apparatus of claim 7, wherein the latch control circuit includes a counter circuit configured to increment a counter value responsive to the clock signal, wherein the counter circuit is configured to provide individual bits of the counter value at an output as respective counter signals.

9. The apparatus of claim 8, wherein the latch control circuit further includes a second delay line circuit configured to delay one of the respective counter signals to provide a delayed counter signal by an amount substantially equal to a delay applied to the clock signal by the first delay line circuit, wherein at least one of the second plurality of control signals is based on the delayed counter signal.

10. The apparatus of claim 9, wherein the latch control circuit further includes a third delay line circuit configured to delay one of the respective counter signals to provide a second delayed counter signal, wherein the delay applied by the third delay line circuit is different than the delay applied by the second delay line circuit, wherein at least one of the second plurality of control signals is based on the second delayed counter signal.

11. The apparatus of claim 9, wherein the latch control circuit further includes latch circuit configured to receive the delayed counter signal and another of the respective counter signals, the latch circuit configured to latch the delayed counter signal and the another of the respective counter signals responsive to the delayed clock signal; wherein at least one of the second plurality of control signals is based on the latched delayed counter signal and the latched another of the respective counter signals.

12. The apparatus of claim 8, wherein the latch control circuit further includes a plurality of second delay line circuits, wherein each of the a plurality of second delay line circuits is configured to delay a respective one of the respective counter signals to provide delayed counter signals, wherein a delay applied by each of the a plurality of second delay line circuits is substantially equal to a delay applied to by the first delay line circuit to the clock signal, wherein the second plurality of control signals are based on the respective delayed counter signals.

13. The apparatus of claim 8, wherein the latch control circuit further includes:
- a plurality of second delay line circuits, wherein each of the a plurality of second delay line circuits is configured to delay a respective one of the first plurality of control signals to provide a delayed first plurality of control signals, wherein a delay applied by each of the a plurality of second delay line circuits is substantially equal to a delay applied to by the first delay line circuit to the clock signal; and
- a latch circuit configured to receive the delayed first plurality of control signals, the latch circuit further configured to latch the delayed first plurality of control signals responsive to the delayed clock signal to provide the second plurality of control signals.

14. A method, comprising:
providing a plurality of counter signals having values indicative of a count value, wherein the count value is changed responsive to a clock signal;
providing a first plurality of control signals based on the plurality of counter signals;
delaying at least one of the plurality of counter signals to provide a plurality of delayed counter signals;
providing a second plurality of control signals based on the plurality of delayed counter signals;
propagating an input signal through a latch circuit responsive to the first plurality of control signals and the second plurality of control signals.

15. The method of claim 14, wherein providing the first plurality of control signals based on the plurality of counter signals comprises asserting one of the first plurality of control signals based on a binary value of the plurality of counter signals; and wherein providing the second plurality of control signals based on the plurality of delayed counter signals comprises asserting one of the second plurality of control signals based on a binary value of the plurality of delayed counter signals.

16. The method of claim 14, wherein delaying at least one of the plurality of counter signals to provide the plurality of delayed counter signals comprises delaying all of the plurality of counter signals by a substantially same amount.

17. The method of claim 14, wherein delaying at least one of the plurality of counter signals to provide the plurality of delayed counter signals comprises delaying all but one of the plurality of counter signals by a substantially same amount.

18. The method of claim 17, further comprising delaying one of the plurality of counter values by a different amount.

19. The method of claim 14, further comprising delaying the clock signal to provide a delayed clock signal, wherein a delay applied to the clock signal is substantially equal to a delay applied to the at least one of the plurality of counter signals.

20. A method, comprising:
providing a plurality of first signals responsive to a first clock signal;
providing a plurality of second signals by delaying at least one of the plurality of first signals;
latching an input signal received at a first node responsive to a respective one of a first plurality of control signals, wherein the respective one of the first plurality of control signals is asserted based on the plurality of first signals; and
providing the latched input signal at a second node responsive to a respective one of a second plurality of control signals, wherein the respective one of the second plurality of control signals is asserted based on the plurality of second signals.

21. The method of claim 20, further comprising asserting the respective one of the second plurality of control signals responsive to a second clock signal, wherein the second clock signal is delayed relative to the first clock signal.

22. The method of claim 21, wherein providing the plurality of second signals by delaying at least one of the plurality of first signals comprises delaying the at least one of the plurality of first signals by an amount that is substantially equal to a relative delay between the first clock signal and the second clock signal.

23. The method of claim 20, wherein providing the plurality of second signals by delaying at least one of the plurality of first signals comprises delaying a first control signal of the plurality of first signals by a first amount and delaying a second control signal of the plurality of first signals by a second amount.

24. The method of claim 20, wherein providing the plurality of first signals responsive to a first clock signal comprises incrementing a binary counter responsive to the first clock signal, wherein each of the plurality of first signals to binary bits are allocated to a respective binary bit of the binary counter.

25. The method of claim 20, wherein the input signal is a read command, the method further comprising providing read data associated with the read command based on timing of provision of the latched input signal to the second node.

* * * * *